(12) United States Patent
Nguyen et al.

(10) Patent No.: US 7,648,741 B2
(45) Date of Patent: Jan. 19, 2010

(54) FORMING A PATTERNED METAL LAYER USING LASER INDUCED THERMAL TRANSFER METHOD

(75) Inventors: Kelvin Nguyen, Rochester, NY (US); Zhihao Yang, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 509 days.

(21) Appl. No.: 11/130,772

(22) Filed: May 17, 2005

(65) Prior Publication Data

US 2006/0263725 A1    Nov. 23, 2006

(51) Int. Cl.
*C23C 14/30* (2006.01)
*H05B 7/00* (2006.01)
*H05B 6/00* (2006.01)
*C23C 14/28* (2006.01)

(52) U.S. Cl. ..................... 427/596; 427/595

(58) Field of Classification Search ................. 427/596
See application file for complete search history.

(56) References Cited

U.S. PATENT DOCUMENTS

| | | | |
|---|---|---|---|
| 4,541,830 A | 9/1985 | Hotta et al. |
| 4,695,287 A | 9/1987 | Evans et al. |
| 4,698,651 A | 10/1987 | Moore et al. |
| 4,701,439 A | 10/1987 | Weaver et al. |
| 4,743,582 A | 5/1988 | Evans et al. |
| 4,753,922 A | 6/1988 | Byers et al. |
| 4,757,046 A | 7/1988 | Byers et al. |
| 4,769,360 A | 9/1988 | Evans et al. |
| 4,900,130 A | 2/1990 | Haas |
| 4,912,083 A | 3/1990 | Chapman et al. |
| 4,942,141 A | 7/1990 | DeBoer et al. |
| 4,948,776 A | 8/1990 | Evans et al. |
| 4,948,777 A | 8/1990 | Evans et al. |
| 4,948,778 A | 8/1990 | DeBoer |
| 4,950,639 A | 8/1990 | DeBoer et al. |
| 4,950,640 A | 8/1990 | Evans et al. |
| 4,952,552 A | 8/1990 | Chapman et al. |
| 4,973,572 A | 11/1990 | DeBoer |
| 5,036,040 A | 7/1991 | Chapman et al. |
| 5,171,650 A | 12/1992 | Ellis et al. |
| 5,244,770 A | 9/1993 | DeBoer et al. |
| 5,256,506 A | 10/1993 | Ellis et al. |
| 5,292,559 A | 3/1994 | Joyce, Jr. et al. |

(Continued)

OTHER PUBLICATIONS

J. Chung et al, "Conductor microstructures by laser curing of printed gold nanoparticle ink", Applied Physics Letters, vol. 84, No. 5, Feb. 2, 2004, pp. 801-803.*

(Continued)

*Primary Examiner*—Timothy Meeks
*Assistant Examiner*—Kelly M Gambetta
(74) *Attorney, Agent, or Firm*—Nelson Adrian Blish

(57) ABSTRACT

A method of forming a pattern of electrical conductors on a receiving substrate (110) comprises forming metal nanoparticles of a conductive material. A donor substrate (45) is formed. A layer of release material (75) is deposited on a first side of the donor substrate. The metal nanoparticles are deposited on the release material. The metal nanoparticulate layer are placed in contact with the receiving substrate. A pattern is written on a sandwich formed by the donor substrate and the receiving substrate, causing metal nanoparticles from the nanoparticulate layer (90) to anneal and transfer to the receiving substrate to form the pattern of electrical conductors on the receiving substrate.

42 Claims, 6 Drawing Sheets

U.S. PATENT DOCUMENTS

| | | | |
|---|---|---|---|
| 5,691,098 A | 11/1997 | Busman et al. | |
| 5,800,960 A | 9/1998 | Boroson et al. | |
| 5,981,136 A | 11/1999 | Chang et al. | |
| 6,031,561 A * | 2/2000 | Narayan et al. | 347/255 |
| 6,097,416 A | 8/2000 | Fassler et al. | |
| 6,099,994 A | 8/2000 | Chang et al. | |
| 6,143,451 A * | 11/2000 | Blanchet-Fincher | 430/11 |
| 6,165,671 A * | 12/2000 | Weidner et al. | 430/201 |
| 6,169,565 B1 * | 1/2001 | Ramanujan et al. | 347/238 |
| 6,190,826 B1 | 2/2001 | Chang et al. | |
| 6,252,621 B1 | 6/2001 | Kessler et al. | |
| 6,582,877 B2 * | 6/2003 | Chang et al. | 430/200 |
| 6,703,111 B2 | 3/2004 | Wang et al. | |
| 6,770,549 B2 | 8/2004 | Hao et al. | |
| 6,790,594 B1 * | 9/2004 | Preuss et al. | 430/272.1 |
| 6,866,979 B2 | 3/2005 | Chang et al. | |
| 2003/0018638 A1 | 1/2003 | Abe et al. | |
| 2004/0028942 A1 | 2/2004 | Culver et al. | |
| 2004/0029039 A1 * | 2/2004 | Tutt et al. | 430/270.11 |
| 2004/0079195 A1 * | 4/2004 | Perry et al. | 75/345 |
| 2006/0003262 A1 | 1/2006 | Yang et al. | |

OTHER PUBLICATIONS

S. Molesa et al.; "High-quality inkjet-printed multilevel interconnects and inductive components on plastic for ultra-low-cost RFID applications" University of California, Berkley.

N. R. Bieri et al.; "Microstructuring by printing and laser curing of nanoparticle solutions" Applied Physics Letters, vol. 82, No. 20, May 19, 2003, pp. 3529-3531.

J. Chung et al.; "Conductor microstructures by laser curing of printed gold nanoparticle ink"; Applied Physics Letters, vol. 84, No. 5, Feb. 2, 2004, pp. 801-803.

Ph. Buffat et al.; "Size effect on the melting temperature of gold particles" Physical Review A, vol. 13, No. 6, Jun. 1976, pp. 2287-2297.

A. N. Goldstein et al.; "Melting in Semiconductor Nanocrystals" Science, vol. 256, Jun. 5, 1992, pp. 1425-1427.

K. K. Nanda et al.; "Liquid-drop model for the size-dependent melting of low-dimensional systems" Physical Review, A 66 (2002), pp. 013028-1 thru 013208-8.

D. Huang et al.; "Plastic-Compatible Low Resistance Printable Gold Nanoparticle Conductors for Flexible Electronics" Journal of The Electrochemical Society, vol. 150, Issue 7, Jul. 2003, Abstract.

* cited by examiner

FORMING A PATTERNED METAL LAYER USING LASER INDUCED THERMAL TRANSFER METHOD

CROSS REFERENCE TO RELATED APPLICATIONS

Reference is made to commonly-assigned copending U.S. patent application Ser. No. 10/881,301, filed Jun. 30, 2004, entitled FORMING ELECTRICAL CONDUCTORS ON A SUBSTRATE, by Yang et al.; the disclosure of which is incorporated herein.

FIELD OF THE INVENTION

The invention relates in general to forming a pattern of conductors on a receiving substrate and in particular to forming conductors on a receiving substrate by annealing and transferring metal nanoparticles from a donor substrate to a receiving substrate.

BACKGROUND OF THE INVENTION

It is often necessary to print large area electrical circuits with conductors having at least one lateral dimension of 1-1000 microns. One process for accomplishing this type of circuit printing is using vacuum deposition. This method, however, is a high-cost operation and is only suitable for batch processing.

Another method of constructing electrical circuits is inkjet printing of patterns using metal nanoparticles to form conductors. This process is discussed in S. Molesa et al.; "High-quality inkjet-printed multilevel interconnects and inductive components on plastic for ultra-low-cost RFID applications." University of California, Berkeley. Some problems associated with this technique are that it is substrate dependent, it is difficult to achieve lateral dimensions of less than 100 microns, and the particles must be annealed by bulk heating, which can cause substrate deformation. Another problem with inkjet deposition is that it often requires multiple passes to deposit the proper amount of material, which reduces throughput.

Attempts to solve the bulk-heating problem, shown in the following two references, involve using high-powered lasers to anneal nanoparticles. N. R. Bieri et al.; "Microstructuring by printing and laser curing of nanoparticle solutions" Applied Physics Letters, Volume 82, Number 20, May 19, 2003, pages 3529-3531; and J. Chung et al.; "Conductor microstructures by laser curing of printed gold nanoparticle ink" Applied Physics Letters, Volume 84, Number 5, Feb. 2, 2004, pages 801-803. Gold nanoparticles, which are used as an example, have low absorption in the visible spectrum resulting in low heating efficiency. This low heating efficiency is a problem in commercial applications because of low writing speeds.

In the copending U.S. patent application Ser. No. 10/881, 301, Yang et al. disclosed a method of forming a pattern of electrical conductors on a substrate by coating metal nanoparticles mixed with a light absorbing dye from a solution on the substrate, and then selectively anneal the metal nanoparticles to conductive material with a laser light.

U.S. Pat. No. 6,770,549 disclosed a method of transferring patterned thin film metal layers from a donor substrate to a receiving substrate by contact adhesion transfer. In this method the pre-patterned metal layers have been formed on the donor substrate by a costly process such as vacuum deposition and sputtering with either a shadow mask or photolithography process.

Laser induced thermal transferring of materials from a donor a donor substrate to a receiving substrate has been disclosed in various prior arts, including U.S. Pat. Nos. 4,948, 778; 5,171,650; 5,244,770; 5,256,506; 5,691,098, 5,800,960; 5,981,136; 6,097,416; 6,099,994; 6,190,826; 6,582,877 and 6,866,979, as well as the U.S. Patent Publication No. 2004/0029039, 2004/0028942, and 2003/018638. However, none of them have shown a method or a process that enables the laser induced thermal transferring and annealing of transferred materials at the same time as what is disclosed in the present invention.

SUMMARY OF THE INVENTION

Briefly, according to one aspect of the present invention a method of forming a pattern of electrical conductors on a receiving substrate comprises forming metal nanoparticles of a conductive material. A donor substrate is formed. A layer of light absorbing material is deposited on a first side of the donor substrate. The metal nanoparticles are deposited on the light absorbing material. The metal nanoparticulate layer are placed in contact with the receiving substrate. A pattern is written on a sandwich formed by the donor substrate and the receiving substrate, causing metal nanoparticles from the nanoparticulate layer to anneal and transfer to the receiving substrate to form the pattern of electrical conductors on the receiving substrate.

According to one embodiment of the invention, a donor element comprises a donor substrate, an infrared (IR) absorbing layer, and a nanoparticle layer; wherein a part of the nanoparticle layer is irradiated and heated by a laser, separated and transferred from the donor substrate to the receiving substrate while a part of the nanoparticle layer is not irradiated by the laser remains attached to the donor substrate.

The invention and its objects and advantages will become more apparent in the detailed description of the preferred embodiment presented below.

DETAILED DESCRIPTION OF THE INVENTION

Figure 1:
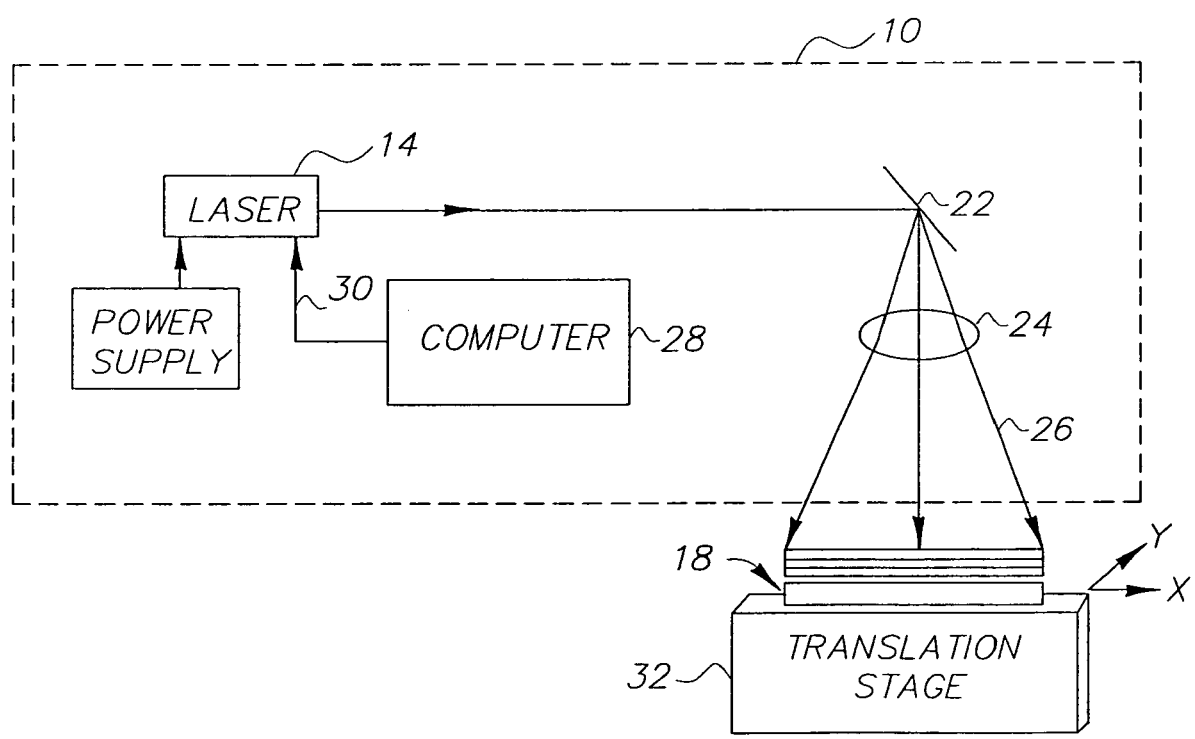
FIG. 1 shows a schematic drawing of an apparatus that is useful for annealing and transferring a nanoparticle layer from a donor substrate to a receiving substrate.

One of the most characteristic features of metal nanoparticles is the size-dependent surface melting point depression. (Ph. Buffat et al.; "Size effect on the melting temperature of gold particles" Physical Review A, Volume 13, Number 6, June 1976, pages 2287-2297; A. N. Goldstein et al. "Melting in Semiconductor Nanocrystals" Science, Volume 256, Jun. 5, 1002, pages 1425-1427; and K. K. Nanda et al.; "Liquid-drop model for the size-dependent melting of low-dimensional systems" Physical Review, A 66 (2002), pages 013208-1 thru 013208-8.) This property would enable the melting or sintering of the metal nanoparticles into polycrystalline films with good electric conductivity. (D. Huang, et al.; "Plastic-Compatible Low Resistance Printable Gold Nanoparticle Conductors for Flexible Electronic" Journal of the Electrochemical Society, Volume 150, Issue 7, July 2003, Abstract.)

The present invention will be directed to a method of forming a pattern of electrical conductors on the receiving substrate by using a laser to anneal and transfer the nanoparticulate layer. In general, a layer of release material is deposited on a first side of the donor substrate. The metal nanoparticles are deposited on the release material. The metal nanoparticulate layer is placed in contact with the receiving substrate. A pattern is written on a sandwich formed by the donor substrate and the receiving substrate, causing metal nanoparticles from the nanoparticulate layer to anneal and transfer to the receiving substrate to form the pattern of electrical conductors on the receiving substrate.

In a preferred embodiment, solution processable metal nanoclusters were formulated with light absorbing dyes in a solvent. The material was coated on top of the IR absorbing layer as a thin film. The metal nanoparticulate layer are placed in contact with the receiving substrate and a laser was used to write on a sandwich formed by the donor substrate and the receiving substrate, causing metal nanoparticles from the nanoparticulate layer to anneal and transfer to the receiving substrate with desired patterns.

The present invention will be directed in particular to elements forming part of, or in cooperation more directly with the apparatus in accordance with the present invention. It is to be, understood that elements not specifically shown or described may take various forms well known to those skilled in the art.

To obtain a laser-annealed conductive material image using the process of the invention, a diode laser is preferably employed since it offers substantial advantages in terms of its small size, low cost, stability, reliability, ruggedness, and ease of modulation. In practice, before any laser can be used to heat the coated element, the element must contain an infrared-absorbing material, such as metals, pigments like carbon black, or cyanine infrared-absorbing dyes as described in U.S. Pat. No. 4,973,572, or other materials as described in the following U.S. Pat. Nos. 4,948,777; 4,950,640; 4,950,639; 4,948,776; 4,942,141; 4,952,552; 5,036,040; and 4,912,083, the disclosures of which are hereby incorporated by reference. The laser radiation is then absorbed IR absorber and converted to heat by a molecular process known as internal conversion. Thus, the construction of a useful absorber will depend not only on the hue, transferability and intensity of the absorber, but also on the ability of the absorber to absorb the radiation and convert it to heat. The infrared-absorbing material or dye may be contained in the metal nanoparticle coating itself or in a separate layer associated therewith, i.e., above or below the absorber layer.

The active layer of element employed in the invention may be coated on the support or printed thereon by any solvent compatible printing technique such as a inkjet, gravure process, hopper coating or other methods known in the art. The metal nanoclusters can be silver, gold, or alloys of metals, other noble metals mixtures such that they can be formed into stable nano clusters. The sizes of the nanoclusters are typically in the range of 1 to 10 nanometers.

Referring now to FIG. 1 there is shown a laser printing apparatus 10 for exposing the substrate 18 imagewise to the laser radiation in accordance with the present invention. The laser 14 of the printing apparatus 10 can be a diode laser or any other high power laser that produces a laser beam 26. More than one laser or laser beam can be used simultaneously in this invention. The beam shape may be oval to allow small lines to be written while using low cost multimode laser, as taught in commonly-assigned U.S. Pat. No. 6,252,621, the disclosure of which is hereby incorporated by reference. In order to scan the laser beam to provide relative movement between laser beam 26 and substrate 18, a galvanometer 22 that includes a moveable mirror scans the beam through an f-theta lens 24 to form a line in direction X. Those skilled in the art will understand that scanning the laser beam can also be accomplished by other kinds of moveable mirrors, such as rotating polygons with mirror faces, or by other devices such as rotating diffraction gratings.

Figure 5:
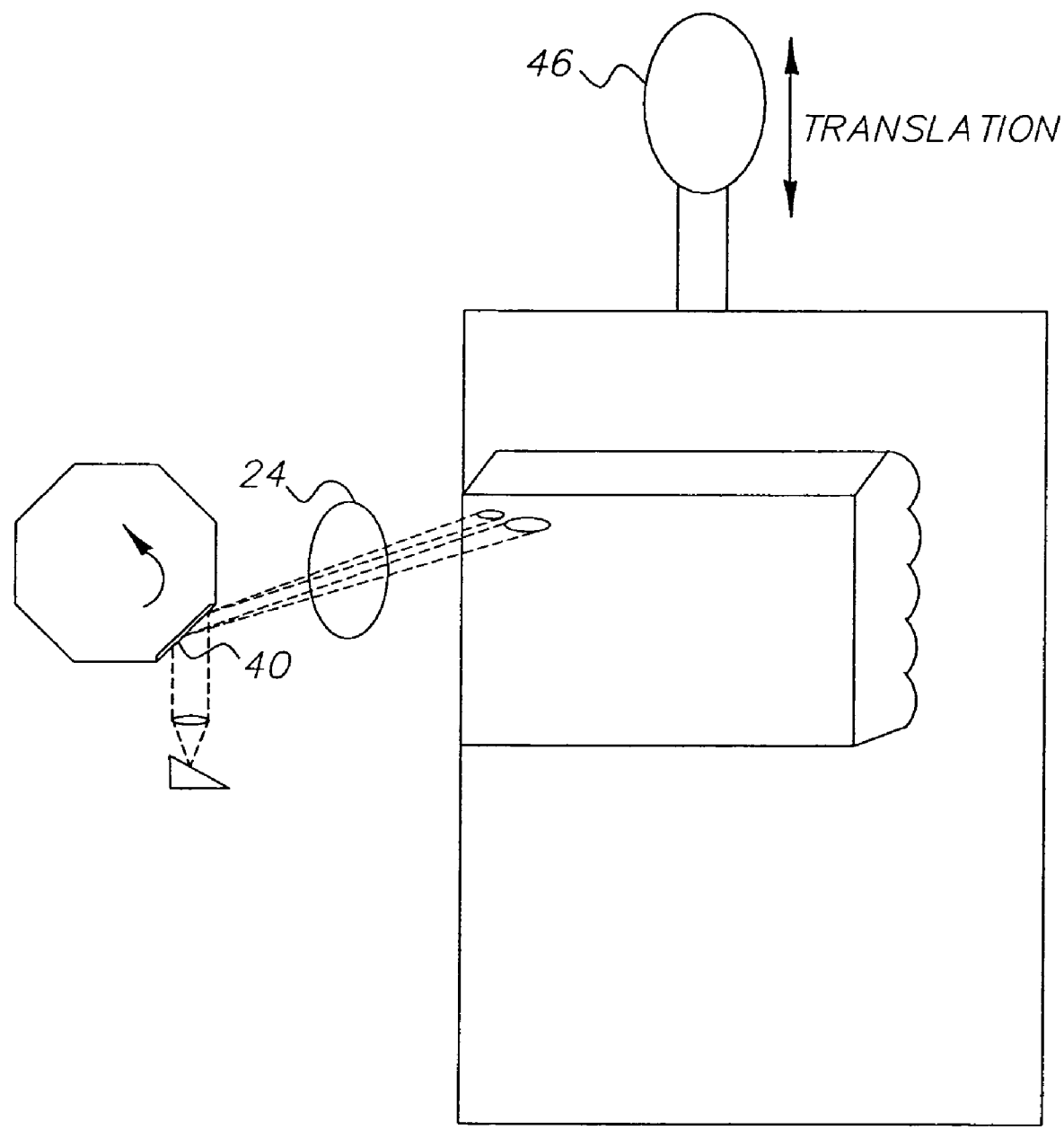
FIG. 5 shows a schematic of an alternate printhead for use with the present invention.

There are various laser thermal printers that can be used to write the image into the nanoparticle coating. The deflector in the scanner could be a rotating polygon deflector 40 like that used in U.S. Pat. No. 6,031,561. Only a single laser source, not shown, would normally be used as polygons rotate many thousands of revolutions per minute and the printing rate is quite fast compared to the previous galvo-scanner. Polygon scanners usually employ an f-theta lens 24 in FIG. 5, that focuses the scanned laser beam onto the receiver surface. Again, the laser source is modulated (or a continuous laser beam can be modulated by a separate modulator, i.e. a acoustic-optic modulator) with image data supplied by an appropriate digital electronics data path. The laser spot is scanned by the polygon deflector in the fast scan direction, while the receiving surface is scanned in the slow scan direction by linear translator 46 of FIG. 5. The laser beam must have sufficient power to heat the nanoparticle coating to a temperature high enough to cause annealing of the nanoparticles. The scanned spot size mostly determines the resolution of the printed line.

Figure 6:
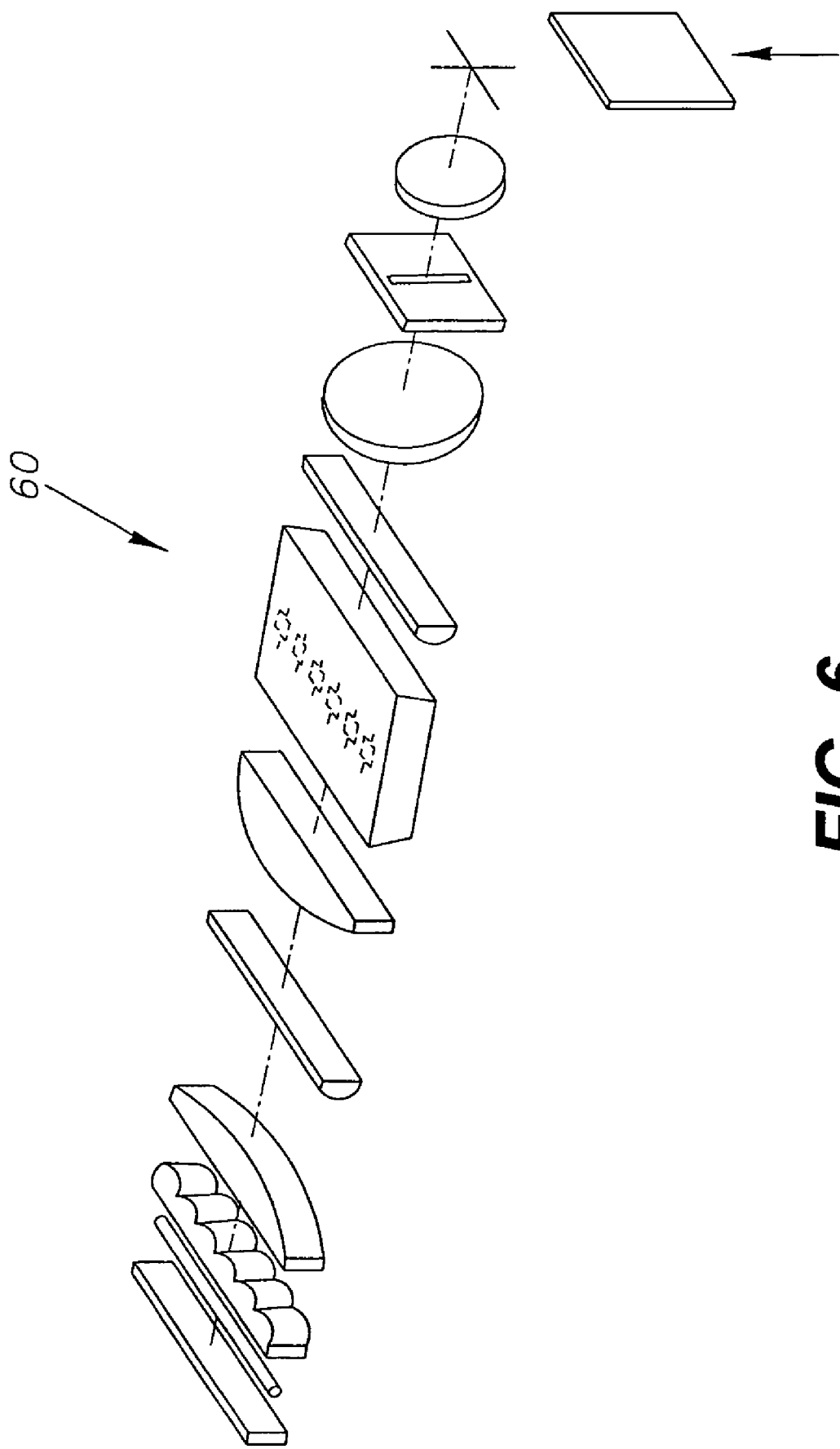
FIG. 6 shows a schematic of an alternate printhead for use with the present invention.
Figure 7:
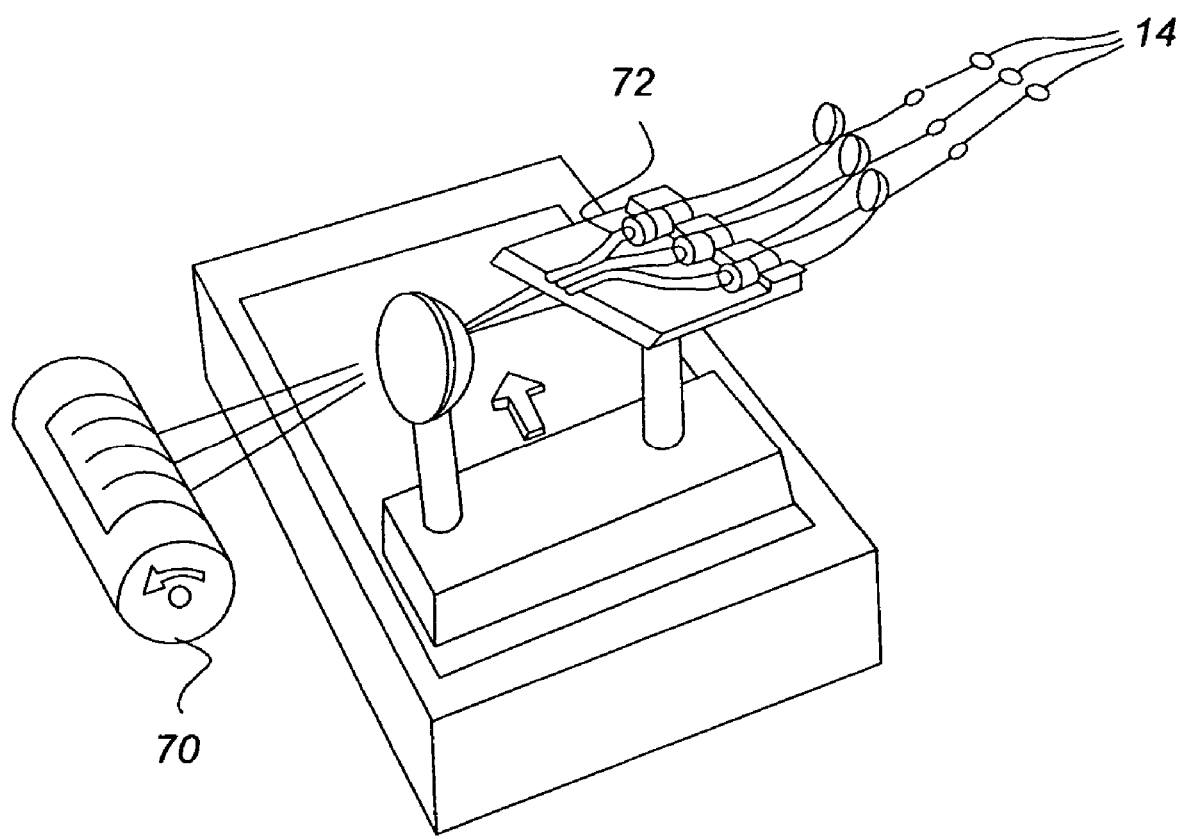
FIG. 7 shows a schematic of an alternate printhead for use with the present invention.

Another printer that would be useful for performing the laser patterning process uses a multichannel printhead 60, like the one shown in FIG. 6 and in U.S. Pat. No. 6,169,565, but suitable folded into a reasonably compact multichannel printhead. The printhead is scanned back and forth in the fast direction at constant velocity (except at the turn around times), and the receiver is advanced by the width of the array of the 256 printing spots after each scan of the printhead. Alternately, the head could print to a receiver sheet that is mounted onto a rotating drum 70 as shown in FIG. 7 discussed in U.S. Pat. No. 4,900,130. The printhead in U.S. Pat. No. 4,900,130 is made with lasers 14 attached to the ends of the fibers 72 being imaged to an array of printing spots at the receiver. This is yet another printhead suitable to the task.

In the embodiment shown in FIG. 1, substrate 18 is transported in a direction Y, which is orthogonal to the line, by a translation stage 32 allowing the full area to be scanned. The intensity of the beam at any point in the scan is controlled by the laser power control line 30 using instructions from the computer 28. Alternatively, the intensity of the laser beam can be controlled by a separate modulator such as an acoustooptic modulator (not shown), as is well known by those skilled in the art of laser optics. In an alternative embodiment, the substrate can remain stationary and the laser apparatus is made to move or its beam redirected optically. The important feature is that there is relative movement between the laser beam and the display substrate in order to allow full area scanning.

Figure 2:
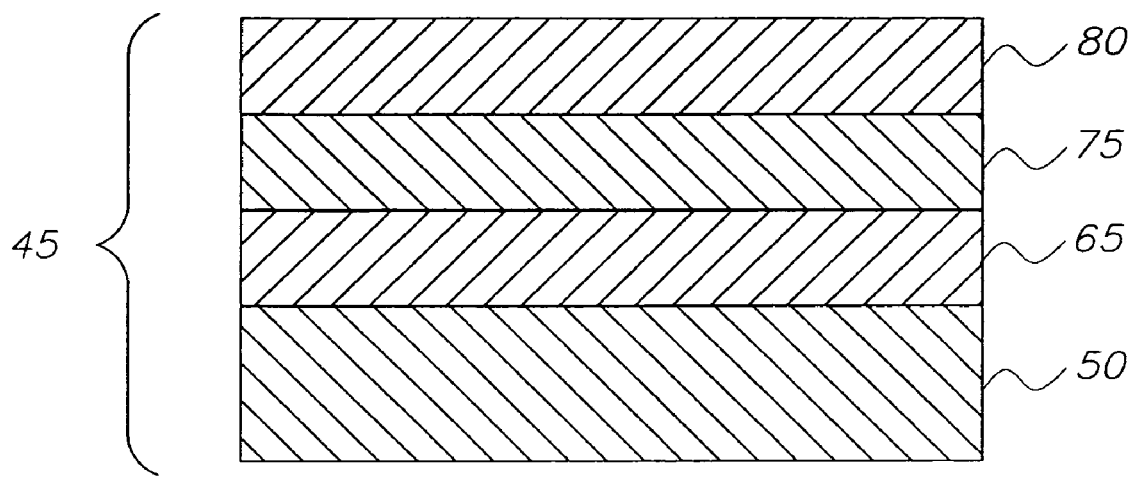
FIG. 2 shows a cross section of a donor substrate according to the present invention.

FIG. 2 now describes one embodiment of the donor substrate used in this invention. Donor substrate 45 includes a donor support 50 and an absorber layer 80. Donor substrate 45 can also optionally include an antireflection layer 65 and/or a releasing layer 80.

Any material can be used as the donor support 50, provided it can withstand the heat of the laser. Such materials include polyesters such as poly(ethylene naphthalate); poly(ethylene terephthalate); polyamides; polycarbonates; cellulose esters such as cellulose acetate; fluorine polymers such as poly (vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyetherimides. Metal substrates and inorganic materials such as glasses, silicon germanium and metal oxides such as aluminum oxide and silicon oxide are also useful for this invention. The donor support 50 can also comprise two or more layers of these materials. The donor support 50 generally has a thickness of from about 5 to about 5000 μM.

Donor support 50 is then coated with an absorber layer 80 capable of absorbing laser light in a predetermined portion of the spectrum to produce heat. Absorber layer 80 can be a metal such as Ag, Au, Be, Co, Cr, Cu, Fe, Ir, Mo, Nb, Ni, Pt, Rh, Ta, Pd, V, Zr or W, or mixtures thereof. Preferred metals from this group are Ni, Mo, Zr, Be, Cr, V, Mo, Pt, or W, or mixtures thereof. Absorber layer 80 can be organic materials or dye, including any of the dyes disclosed in U.S. Pat. Nos. 4,541,830; 4,698,651; 4,695,287; 4,701,439; 4,757,046; 4,743,582; 4,769,360; 4,753,922 and 6,703,111. The above dyes may be employed singly or in combination with other dyes.

Antireflection layer 65 is an optional layer in donor substrate 45 and includes a material having the real portion of its index of refraction greater than 3.0. This includes materials such as silicon, germanium, and combinations thereof. Particularly useful combinations of antireflection layer 65 and an absorptive layer 80 include silicon with chromium, and germanium with nickel. The use of an antireflection layer, and the process of matching an effective antireflection layer with an absorber layer, has been described in commonly-assigned U.S. Pat. No. 6,790,594, the disclosure of which is herein incorporated by reference.

In one embodiment of present invention, a releasing layer 75 is coated above or below the absorber layer to facilitate the release of the metal nanoparticulate layer. In a preferred embodiment, the releasing layer comprises a gas-producing polymer being capable of forming a gas upon heating by the laser and an infrared-absorbing material, the releasing layer having been coated using a polar solvent having an $E_t$ value of between about 0.3 and 1.0 as disclosed in U.S. Pat. No. 6,165,671. In another preferred embodiment, the gas-producing polymer is a cyanoacrylate. In another preferred embodiment, the releasing layer comprises a polymer having the glass transition temperature less than 150° C., more preferably less than 100° C.

Figure 3:
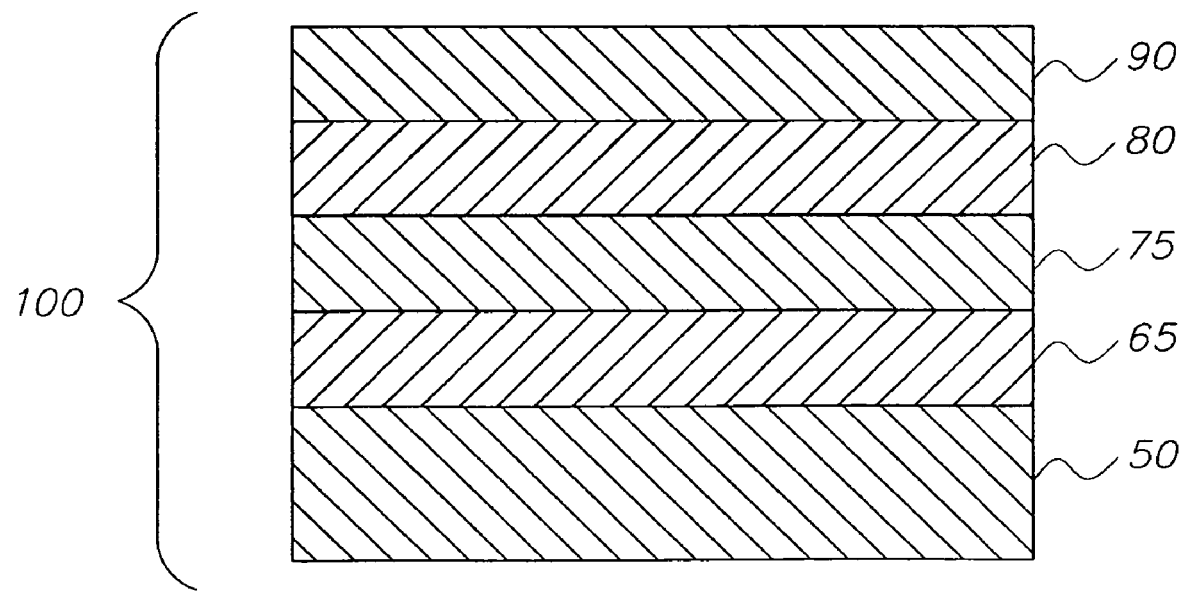
FIG. 3 shows a cross section of a donor element according to the present invention.

FIG. 3 shows a cross section of a donor element 100 according to the present invention. The metal nanoparticulate layer 90 with metal nanoparticles having diameter less 100 nm, preferably less than 50 nm are synthesized and coated on an absorber layer 80 is made from a solution comprising the metal nanoparticles having a concentration of from 1% to 80%, preferably form 10% to 40%. The light absorbing dye having a concentrate of from 0.1% to 20%, preferably from 1% to 5% can be added into the metal nanoparticles solution to promote the conversion property of the metal nanoparticles.

The synthesis of Au nanoparticles was conducted by the following procedure. Fourteen grams of tetraoctyl ammonium bromide were dissolved in 400 ml of toluene and 3.0 grams of hydrogen tetrachloroaurate ($HAuCl_4$) were dissolved in 100 ml of water. Pour the tetrachloroaurate/water mixture into a flask that contains the tetraoctyl ammonium bromide/toluene. Cap and shake the flask for a few seconds. Pour the mixture into a separatory funnel, allow the water/toluene layers to separate, and then collect the top layer (toluene) solution. Take the reddish brown organic phase and put it back into a round bottom flask. Add a solution of 4.7 grams of hexanethiol in 25 ml of toluene to the flask and stir for 10 minutes until the solution becomes colorless. Dissolve 3.8 grams of sodium borohydride into 175 ml of water. While vigorous stirring, add the NaBH4 solution to the organic phase over two minutes using a dropping funnel. Let stir for 3.5 hours and collect materials from the organic phase using a separatory funnel. Solvent was removed by Roto-evaporation (keep temperature less than 50 C). Add 100 ml of ethanol to the round bottom flask with product, and sonicate mixture for 2 minutes. Filter this material using a fine fritted glass filter, and wash precipitate with 100 ml of ethanol. The product (gold nanoparticles) was dried in a vacuum oven with no heat for an hour and measured to be 0.8 to 1 grams. The nanoparticles have the size of 2-4 nm examined by TEM, and show a melting or sintering temperature of 190-200 C by DSC.

The coating solution was formulated using the following recipes:
Solution 1: 10% Au nanoparticles and 1% IR Dye 1 were dissolved in a 40/60 mixed solvent of ethanol/toluene.
Solution 2: 20% Au nanoparticles and 2% IR dye 1 were dissolved in a 40/60 mixed solvent of ethanol/toluene.

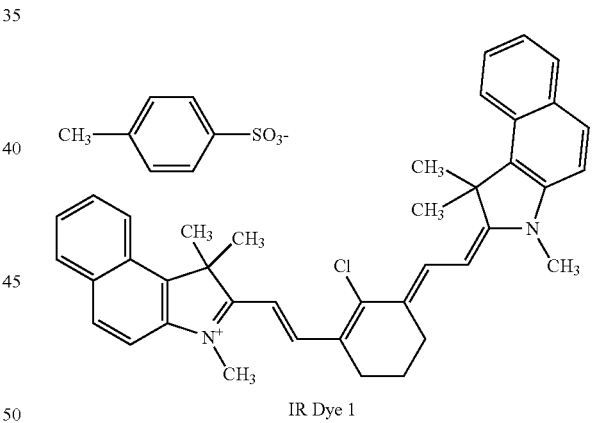

IR Dye 1

The solutions were coating on 4 mil PET substrates by either hand coating with coating blades or coating rods, or by machine coating through a hopper. The wet lay-down of coatings was calculated ranging from 5 um to 25 um. The final dry thicknesses of coating were measured ranging from 0.15 um to 2 um.

Figure 4A:
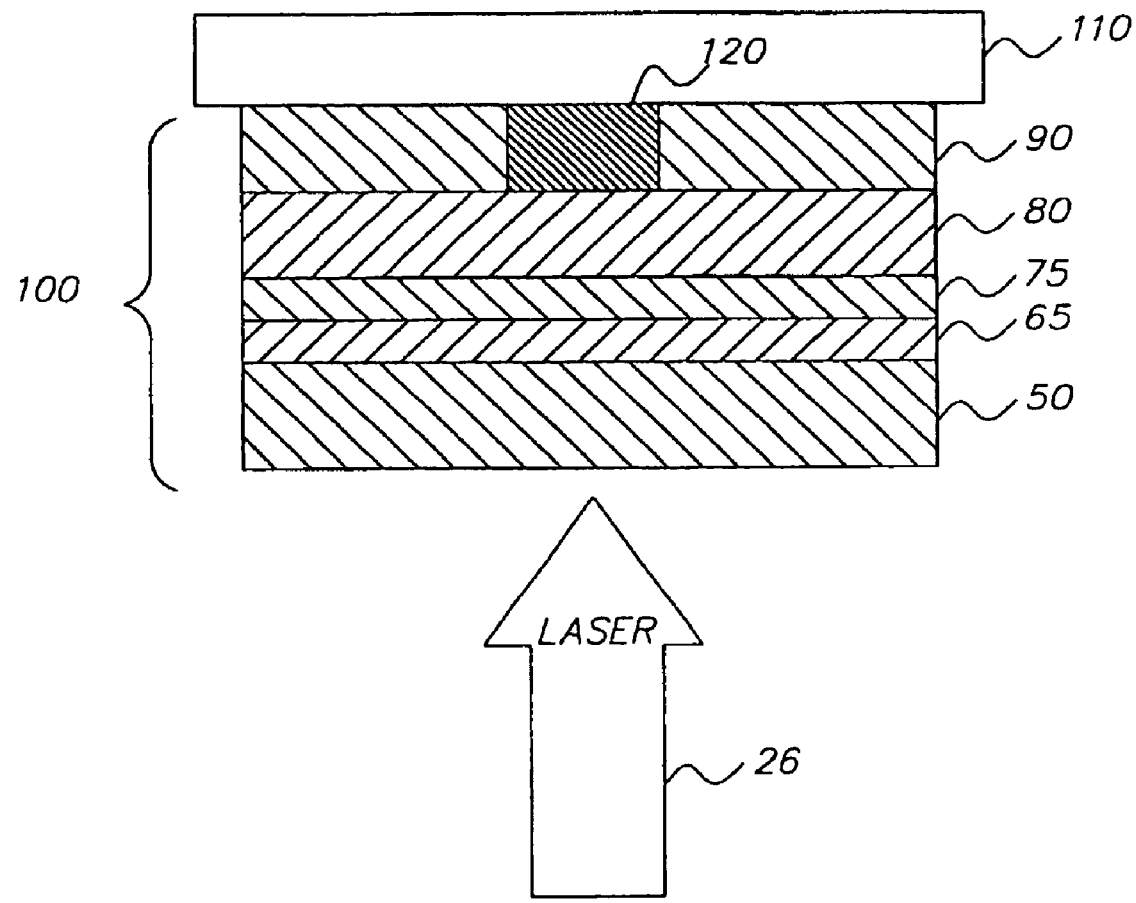
FIGS. 4a and 4b show cross sections of a donor element with a portion of the nanoparticle layer annealed and transferred onto a receiving substrate according to the present invention.
Figure 4B:
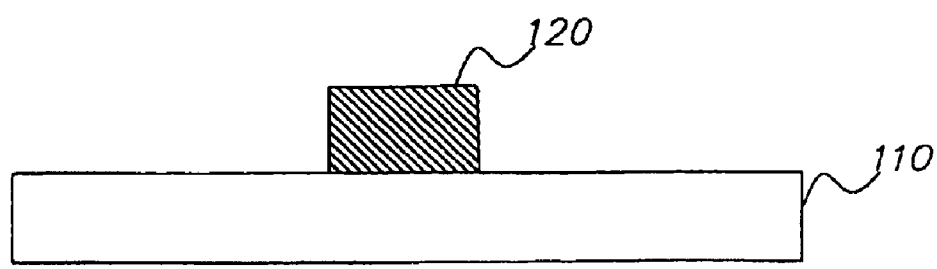

FIGS. 4a and 4b show cross sections of a donor element with a portion of the nanoparticle layer annealed and transferred onto a receiving substrate according to the present invention. Antireflection layer 65 and releasing layer 75 is deposited on a first side of the donor substrate 50. An infrared (IR) absorbing layer 80 is coated on top of the releasing layer 75 to absorb and convert the laser light into heat. The metal nanoparticles layer 90 are prepared in solution and deposited on the IR absorbing layer 80 evenly. The donor element 100 is then placed in such a way that the metal nanoparticulate layer 90 are in contact with the receiving substrate 110. A laser beam 26 is activated to cause laser light to illuminate donor element 100. The laser light is absorbed by and heats selected portions of energy-absorbing layer 80 and thereby heats selected portions of nanoparticle layer 90 to a sufficient level to anneal the nanoparticle to form a metallic conductive film 120. The donor element 100 and the receiving substrate 110 are then separated in a way wherein a part of the nanoparticle layer 90 was irradiated and heated by a laser, separated and transferred from the donor element 100 to the receiving substrate 110 to form the pattern of electrical conductors on the receiving substrate 110, while a part of the nanoparticle layer is not irradiated by the laser remained attached to the donor element 100.

Receiving substrate 110 can be an organic solid, an inorganic solid, or a combination of organic and inorganic solids that provides a surface for receiving metallic conductive film from a donor element 100 and can be rigid or flexible. Typical substrate materials include glass, plastic, metal, ceramic, semiconductor, metal oxide, semiconductor oxide, semiconductor nitride, or combinations thereof. Receiving substrate 110 can be a homogeneous mixture of materials, a composite of materials, or multiple layers of materials. Receiving substrate 110 can be an OLED substrate, that is, a substrate commonly used for preparing OLED devices, e.g. active-matrix low-temperature polysilicon TFT substrate. The receiving substrate 110 can either be light transmissive or opaque. Receiving substrate 110 can be coated with other layers prior to the transfer step.

The invention and its advantages can be better appreciated by the following examples.

EXAMPLE 1

A donor element was constructed in the following manner:

An antireflection layer of 40 nm of silicon and an absorption layer of 40 nm of chromium were vacuum-deposited in that order onto a 51 micron polyimide donor substrate. 20% of gold nanoparticles of size of 2-4 nm and 1-2% of IR absorbing dye were dispersed in 40/60 mixed solvent of ethanol/toluene and coated on the chrominum layer with a wet lay-down of 1 cc/sq ft. The sample was then dried at room temperature for 10 minutes to give a final thickness of about 300-500 nm.

Receiving Substrate

The receiving substrate used in the invention was 4 mil PET films with a 0.3 um of gelatin coating on the receiving side of the surface.

Annealed and Transferred of Metal Nanoparticle Layer

The metal nanoparticulate layer are placed in contact with the gel layer of the receiving substrate and held down by using the vacuum. In regions in which annealing and transferring is desired, a laser writer containing a laser diode at 830 nm and max power of 600 mW was used to anneal the coated nanoparticles and write patterns by scanning through the second side of the donor support according to pre-determined images. The scanning speed was set as such that the laser exposure on the coated substrate at the energy level about 1.3 J/cm$^2$. Separate the donor element and the receiver substrate slowly so that part of the nanoparticle layer is irradiated and heated by a laser transferred from the donor substrate to the receiving substrate while a part of the nanoparticle layer is not irradiated by the laser remains attached to the donor substrate.

EXAMPLE 2

A donor element and a receiving substrate satisfying the requirements of this invention was constructed as Example 1, except that 20% of silver nanoparticle with size of 50-70 nm (from CIMA Nanotech of St. Paul, Minn.) was dispersed in ethylene glycol butyl ether acetate solution containing 2% of IR absorbing dye.

EXAMPLE 3

A donor element and a receiving substrate satisfying the requirements of this invention was constructed as Example 1, except that 20% of silver nanoparticle size of 50-70 nm (from CIMA Nanotech of St. Paul, Minn.) was dispersed in water and ethanol mixed solvent containing 2% of IR absorbing dye.

The results of laser annealed and transferred patterned Au and Ag conductors on gel coated PET are shown in the Table 1.

TABLE 1

| Coating Solution | Wet Lay-down (cc/sq ft) | Dry Thickness (um) | Resistivity (Ohm-cm) |
| --- | --- | --- | --- |
| Example 1 | 1 | 0.3 | $7.5 \times 10^{-5}$ |
| Example 2 | 1 | 0.5 | $3.6 \times 10^{-5}$ |
| Example 3 | 1 | 0.5 | $3.2 \times 10^{-5}$ |

Table 1 shows that upon laser transferring and annealing, the resistivity transferred metal layers on the gel coated PET drops to a very conductive state. The nanoparticle layers not irradiated by the laser remain nonconductive on the donor substrates due to the lack of sintering.

The invention has been described in detail with particular reference to certain preferred embodiments thereof, but it will be understood that variations and modifications can be effected within the scope of the invention.

PARTS LIST 10 laser printing apparatus
14 laser
18 substrate
22 galvanometer
24 f-theta lens
26 laser beam
28 computer
30 laser power control line
32 translation stage
40 polygon
45 donor substrate
46 linear translator
50 donor support
60 multichannel printhead
65 antireflection layer
70 rotating drum
72 fibers
75 releasing layer
80 absorbing layer
90 nanoparticle layer
100 donor element
110 receiving substrate
120 metallic conductive film

The invention claimed is:

1. A method of forming a pattern of electrical conductors on a receiving substrate comprising:

forming a donor element by depositing a layer of light absorbing material on a first side of a donor substrate and then depositing a layer of metal nanoparticles on said layer of light absorbing material;

placing said layer of metal nanoparticles on said donor element in contact with a receiving substrate; and writing a pattern, with a laser, on a sandwich formed by said donor element and said receiving substrate, causing metal nanoparticles from said layer of metal nanoparticles to anneal and transfer to said receiving substrate to form a pattern of electrical conductors on said receiving substrate.

2. A method as in claim 1 comprising the additional step of: mixing said metal nanoparticles with a light absorbing moiety.

3. A method as in claim 1 comprising the additional step of: forming an antireflection layer on said donor substrate prior to depositing said layer of light absorbing material.

4. A method as in claim 1 comprising the additional step of: forming an antireflection layer on a second side of said donor element.

5. A method as in claim 1 comprising the additional step of: forming an adhesive layer on said receiving substrate.

6. A method as in claim 1 wherein said laser writes to a second side of said donor element.

7. A method as in claim 1 wherein said laser writes to said receiving substrate.

8. A method as in claim 1 wherein said donor substrate is flexible.

9. A method as in claim 1 wherein said nanoparticles are selected from a group consisting of gold, silver, palladium, and platinum.

10. A method as in claim 1 wherein said metal nanoparticles have an organic shell.

11. A method as in claim 1 wherein said nanoparticles are less than 100 nm lateral dimension.

12. A method as in claim 1 wherein said nanoparticles are less than 50 nm lateral dimension.

13. A method as in claim 1 wherein said light absorbing material is an infrared absorbing material.

14. A method as in claim 1 wherein said laser light is produced by an infrared laser.

15. A method as in claim 1 wherein said laser light is produced by a printhead comprised of a plurality of lasers.

16. A method as in claim 1 wherein said laser light is produced by a multichannel laser printhead.

17. A method as in claim 1 wherein said laser light is produced by a polygon laser scanner.

18. A method as in claim 1 wherein said laser light anneals said nanoparticles during transfer from said donor element to said receiver.

19. A method of forming a pattern of electrical conductors on a receiving substrate comprising:

forming metal nanoparticles of a conductive material;

forming a donor element by depositing a layer of releasing material on a first side of a donor substrate;

depositing a layer of light absorbing material on said layer of releasing material; and then depositing said metal nanoparticles on said light absorbing material to form a layer of metal nanoparticles;

placing said layer of metal nanoparticles on said donor element in contact with a receiving substrate; and writing a pattern, with a laser, on a sandwich formed by said donor element and said receiving substrate, causing metal nanoparticles from said layer of metal nanoparticles to anneal and transfer to said receiving substrate to form a pattern of electrical conductors on said receiving substrate.

20. A method as in claim 19 comprising the additional step of: mixing said metal nanoparticles with a light absorbing moiety.

21. A method as in claim 19 comprising the additional step of: forming an antireflection layer on said donor substrate prior to depositing said layer of light absorbing material.

22. A method as in claim 19 comprising the additional step of: forming an antireflection layer on a second side of said donor substrate.

23. A method as in claim 19 comprising the additional step of: forming an adhesive layer on said receiving substrate.

24. A method as in claim 19 wherein said laser writes to a second side of said donor element.

25. A method as in claim 19 wherein said laser writes to said receiving substrate.

26. A method as in claim 19 wherein said donor substrate is flexible.

27. A method as in claim 19 wherein said nanoparticles are selected from a group consisting of gold, silver, palladium, and platinum.

28. A method as in claim 19 wherein said metal nanoparticles have an organic shell.

29. A method as in claim 19 wherein said nanoparticles are less than 100 nm lateral dimension.

30. A method as in claim 19 wherein said nanoparticles are less than 50 nm lateral dimension.

31. A method as in claim 19 wherein said light absorbing material is an infrared absorbing material.

32. A method as in claim 19 wherein said laser light is produced by an infrared laser.

33. A method as in claim 19 wherein said laser light is produced by a printhead comprised of a plurality of lasers.

34. A method as in claim 19 wherein said laser light is produced by a multichannel laser printhead.

35. A method as in claim 19 wherein said laser light is produced by a polygon laser scanner.

36. A method as in claim 19 wherein said laser light anneals said nanoparticles during transfer from said donor element to said receiving substrate.

37. A method as in claim 19 wherein said layer of releasing material comprises a gas-producing polymer being capable of forming a gas upon heating by the laser and an laser-absorbing material.

38. A method as in claim 37 wherein said gas-producing polymer is a cyanoacrylate.

39. A method as in claim 19 wherein said layer of releasing material comprises a polymer having the glass transition temperature less than 150° C.

40. A method as in claim 19 wherein said layer of releasing material comprises a polymer having the glass transition temperature less than 100° C.

41. A method of forming a pattern of electrical conductors on a receiving substrate comprising:

forming metal nanoparticles of a conductive material;

mixing said metal nanoparticles with a light absorbing moiety to form a mixture of metal nanoparticles and light absorbing moiety;

depositing a light absorbing layer on a donor substrate;

forming a donor element by depositing said mixture of metal nanoparticles and light absorbing moiety on said light absorbing layer on said donor substrate;

placing said layer that is a mixture of metal nanoparticles and light absorbing moiety in contact with said receiving substrate; and writing a pattern, with a laser, on a sandwich formed by said donor element and said receiving substrate, causing metal nanoparticles from said layer that is a mixture of metal nanoparticles and light absorbing moiety to anneal and transfer to said receiving substrate to form a pattern of electrical conductors on said receiving substrate.

42. A method as in claim 41 comprising the additional step of:

forming a releasing layer on said donor substrate prior to depositing said layer of a mixture of metal nanoparticles and said light absorbing moiety.

* * * * *